United States Patent [19]

Miyatake et al.

[11] Patent Number: 4,823,322

[45] Date of Patent: Apr. 18, 1989

[54] DYNAMIC RANDOM ACCESS MEMORY DEVICE HAVING AN IMPROVED TIMING ARRANGEMENT

[75] Inventors: Hideshi Miyatake; Masaki Kumanoya; Hideto Hidaka; Yasuhiro Konishi; Katsumi Dosaka; Hiroyuki Yamasaki; Masaki Shimoda; Yuto Ikeda; Kazuhiro Tsukamoto, all of Itami, Japan

[73] Assignee: Mitsubishi Denki Kabushiki Kaisha, Tokyo, Japan

[21] Appl. No.: 102,683

[22] Filed: Sep. 30, 1987

[30] Foreign Application Priority Data

Nov. 29, 1986 [JP] Japan .................................. 61-284850

[51] Int. Cl.$^4$ .............................................. G11C 7/00
[52] U.S. Cl. .................................... 365/190; 365/233; 365/149
[58] Field of Search ............... 365/149, 190, 230, 233, 365/189, 193

[56] References Cited

U.S. PATENT DOCUMENTS 4,376,989  3/1983  Takemae ............................ 365/233
4,656,612  4/1987  Allan ................................. 365/194
4,739,502  4/1988  Nozaki .............................. 365/233

OTHER PUBLICATIONS

Chwang et al, "A 70ns High Density 64K CMOS Dynamic RAM", IEEE Jour. of Solid State Circuits, vol. SC–18, No. 5, Oct. 1983, pp. 457–463.

Primary Examiner—Stuart N. Hecker
Assistant Examiner—Glenn A. Gossage
Attorney, Agent, or Firm—Sughrue, Mion, Zinn, Macpeak and Seas

[57] ABSTRACT

A dynamic random access memory device having an input/output load connected between a pair of input-/output lines and a control circuit used to generate an internal /RAS signal having a reset transition delayed with respect to the same transition of the external /RAS signal. The internal /RAS signal controls at least a word signal applied to a transistor of a selected memory cell and an enable signal applied to an enable transistor, whereby the time the transistor of the memory cell and the enable transistor become non-conductive is delayed with respect to the time at which a transfer transistor connected between each pair of bit lines and the input-/output lines becomes non-conductive.

17 Claims, 4 Drawing Sheets

DYNAMIC RANDOM ACCESS MEMORY DEVICE HAVING AN IMPROVED TIMING ARRANGEMENT

BACKGROUND OF THE INVENTION

The present invention relates to a dynamic RAM (Random Access Memory) device.

Recent dynamic RAM devices have commonly employed what is termed a "static column" mode to increase the read-out speed and reduce the cycle time of the device. To realize this mode, a columnar arrangement of static circuits is employed, similarly to a static RAM device, which makes it unnecessary to provide a precharge circuit as in the case of other dynamic RAM devices. That is, each input/output line is pulled up to a predetermined potential through an input/output load by a supply potential $V_{cc}$ so that it cannot be swung within the full range from ground potential to $V_{cc}$. As a result, it is possible to make the column decoder a static-type decoder.

FIG. 1 is a circuit diagram of a typical D-RAM (Dynamic Random Access Memory) device. The D-RAM includes a plurality of memory cells, pairs of bit lines, word lines, sense amplifier circuits, a pair of input/output lines, etc. In FIG. 1, each memory cell includes one N-type MOS (Metal Oxide Semiconductor) translator 4 and one charge storage device 12 such as a capacitor. The transistor 4 is connected between a respective bit line BL or /BL ("/" denoting negation, i.e., the complementary form of the signal, as shown in the drawings by the more conventional bars over the signal designations) and one electrode of the charge storage device 12. The gate electrode of the transistor 4 is connected to a corresponding word line WL. The other electrode of the charge storage device is grounded.

Each sense amplifier circuit 16 has two driver N-type MOS transistors 5 and 6 and two load P-type MOS transistors 2 and 3. A first driver transistor 5 is connected between the bit line BL and a first common node 16a, and a gate electrode of the transistor 5 is connected to the other bit line /BL. A second driver transistor 6 is connected between the other bit line /BL and the first common node 16a, and a gate electrode thereof is connected to the one bit line BL. A first load transistor 2 is connected to the bit line BL. A first load transistor 2 is connected between the bit line BL and a second common node 16b, and a gate electrode thereof is connected to the other bit line /BL. A second load transistor 3 is connected between the bit line /BL and the second common node 16b, and the gate electrode thereof is connected to the bit line BL.

A first enable N-type MOS transistor 7 is connected between the first common node 16a and ground, and a gate electrode thereof receives a first enable signal $S_0$. A second enable P-type MOS transistor 1 is connected between the second common node 16b and a supply potential node, and a gate electrode thereof receives a second enable signal /$S_0$.

An equalizer circuit 14 is coupled between the two bit lines BL and /BL for equalizing the potential between the two lines prior to information stored in the memory cell being read out when the cell is selected for read out. The equalizer circuit is implemented with an N-type MOS transistor connected between the bit lines BL and /B, a gate electrode thereof receiving an enabling signal.

A first transfer N-type MOS transistor 8 is connected between the bit line BL and the uncomplemented input/output line I/O. The gate electrode of the transistor 8 receives a column signal $Y_i$ generated by a column decoder 15. A second transfer N-type MOS transistor 9 is connected to the complemented bit line /BL and the complemented input/output line /I/O. The gate electrode of this transistor is connected to the gate electrode of the first transistor 8 and receives the column signal $Y_i$.

An input/output load 13, composed of two N-type MOS transistors 10 and 11, is connected to the two input/output lines I/O and /I/O. The first load transistor 10 is connected between the input/output line I/O and a supply potential node, and the gate electrode thereof is connected to the supply potential node. The second load transistor 11 is connected between the complemented input/output line /I/O and the supply potential node, while the gate electrode of this transistor is connected to the supply potential node.

FIG. 2 shows waveforms in the conventional D-RAM device.

In the operation of this device, it is assumed that the selected memory cell connected to the bit line BL has stored therein a "1" data bit. The potential of the bit lines BL and /BL will be about half the supply potential. The external signal /RAS goes from an "H" (high) level to a "L" (low) level, as shown in waveform (a), at time $t_0$. Then, at time $t_1$, the word signal on the selected word line WL goes from "L" to "H", according to the change in /RAS, as shown in waveform (b). As a result, the transistor 4 of the selected memory cell is rendered conductive, and the potential of the bit line BL goes up, as shown in waveform (c). At time $t_2$, the potential of the first enable signal $S_0$ goes from "L" to "H" and the potential of /$S_0$ goes to "L" from "H", as shown in waveforms (d) and (e) in FIG. 2. Thus, the first and second enable transistors 7 and 8 are placed in the conductive state and the sense amplifier is also enabled.

The sense amplifier 16 amplifies the potential between the two bit lines BL and /BL. At this time, the potential of the bit line BL is at the "H" level ($V_{cc}$), while the potential on the complemented bit line /BL is an "L" level (ground), as shown in waveform (c). At time $t_3$, the column signal $Y_i$ from the column decoder 15 goes high, as seen in waveform (f), and the first and second transfer transistors 8 and 9 are rendered conductive. Accordingly, the potential of the bit lines BL and /BL is transferred to the input/output lines I/O and /I/O, respectively. That is, the potential of I/O is the "H" level and the potential of /I/O is an intermediate level, as shown in waveform (g).

Because current flows from the supply potential node to ground through the input/output load transistor 11, the input/output line /I/O, and the second transfer transistor 9, the bit line /BL, the second driver transistor 6, the first common node 16a, and the first enable transistor 7, and the drive capacities of the load transistors 10 and 11 and the drive transistors 5 and 6 are substantially the same, the potential of the input/output line /I/O will not swing by the full potential difference between $V_{cc}$ and ground. That is, the potential of the bit line /BL is limited to the intermediate potential $V_m$, which is less than half the supply potential $V_{cc}$, as indicated in waveform (c).

At time $t_4$, the external signal /RAS goes high, as seen in waveform (a). The word signal WL and the column signal Y, go to the "L" level from the "H" level following the /RAS signal, as shown in waveforms (b) and (f). As a result, the transistor 4 of the selected memory cell and the transfer transistors 8 and 9 are rendered nonconductive. The input/output line /I/O goes up to the supply potential, as shown in waveform (g). At time $t_5$, the first enable signal $S_0$ goes down to the "L" level from the "H" level following the change in the external signal /RAS, while the second enable signal $S_0$ makes the opposite transition, as shown in waveforms (d) and (e), and the first and second enable transistors 7 and 1 are nonconductive. As a result, the sense amplifier 16 is disabled. Subsequently, the equalizer circuit 14 is enabled, and the potentials of the two bit lines BL and /BL are made the same.

In the case where the selected memory cell has stored therein a "0" data bit, the operation is the same as described above, except that the potentials of the bit lines BL and /BL will be as shown in waveform (c').

In the D-RAM device constructed and operated as described above, when a "0" data bit is stored in the memory cell, the intermediate potential $V_m$ will remain on the charge storage device at the completion of the read-out operation. As a result, during the following read-out operation, incorrect information can be read out.

SUMMARY OF THE INVENTION

Accordingly, it is an object of the present invention to provide a D-RAM device with an input/output load connected to a pair of input/output lines, as in the device described above, but with which the incorrect information cannot be read out.

In accordance with this and other objects, the present invention provides a D-RAM device having an input/output load and which has a control circuit which generates an internal /RAS signal in response to the external /RAS signal. The reset timing of the internal /RAS signal is delayed with respect to the external /RAS signal. The internal /RAS signal controls at least the word signal which enables the selected memory cell and the enable signal which enables the sense amplifier, whereby the time the transistor of the memory cell and the enable transistors are rendered nonconductive is delayed from the time at which the transfer transistor is rendered nonconductive.

DESCRIPTION OF THE PREFERRED EMBODIMENTS

Figure 1:
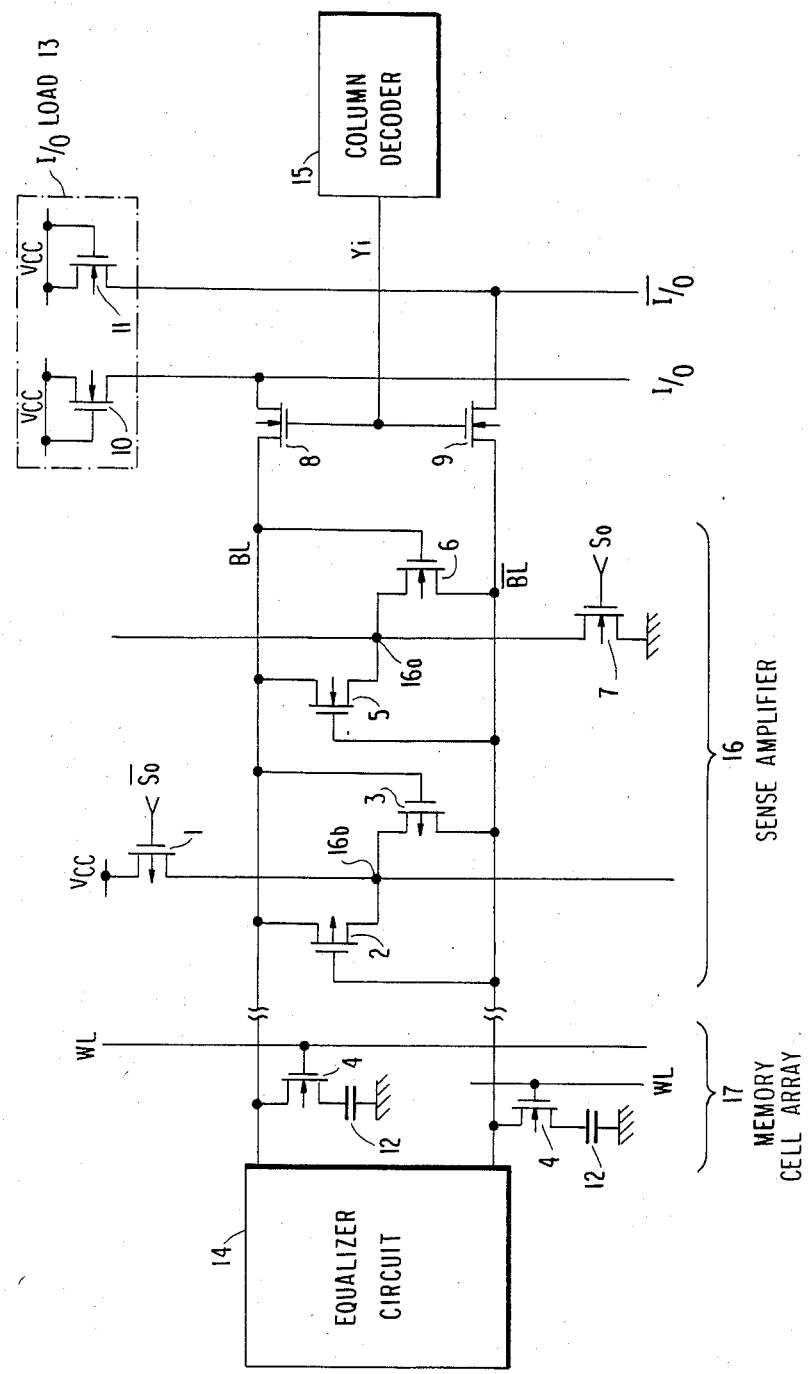
FIG. 1 is a circuit diagram of a typical conventional D-RAM device.
Figure 2:
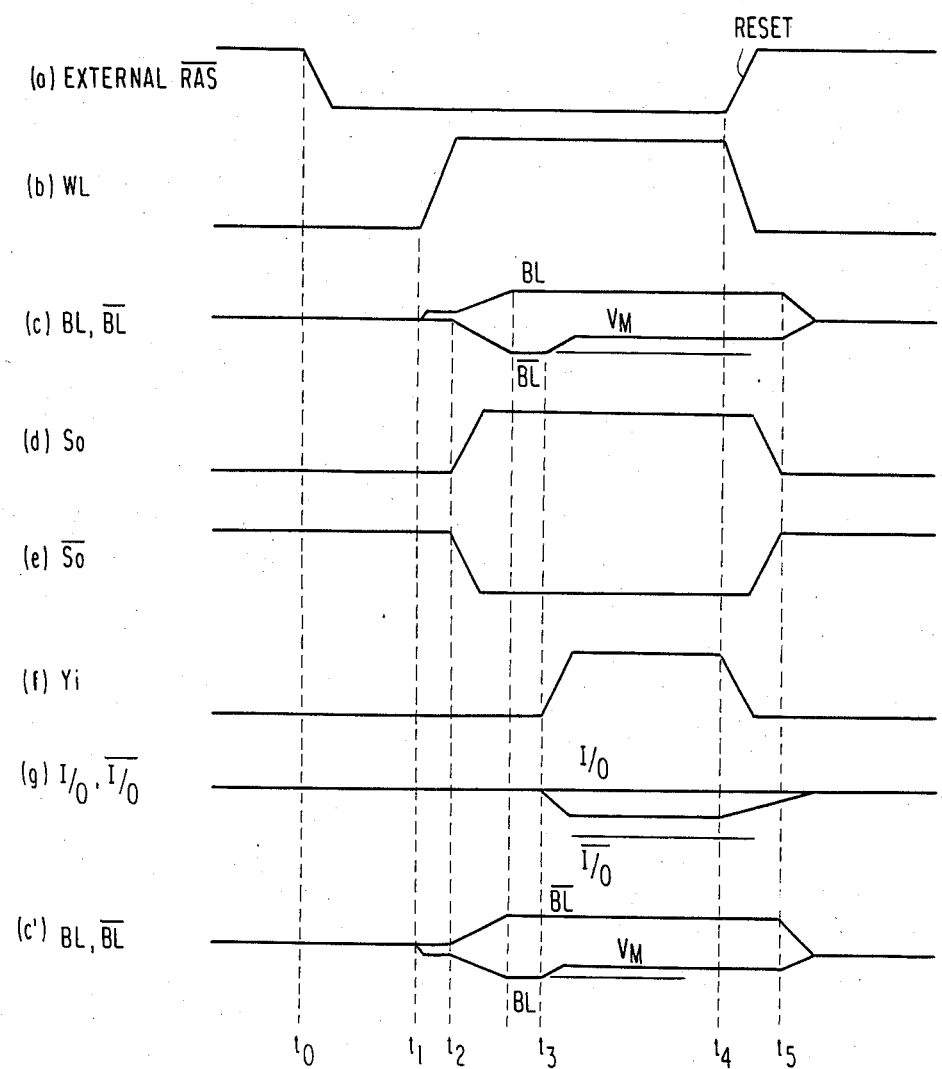
FIG. 2 shows a series of waveforms in the D-RAM of FIG. 1.
Figure 3:
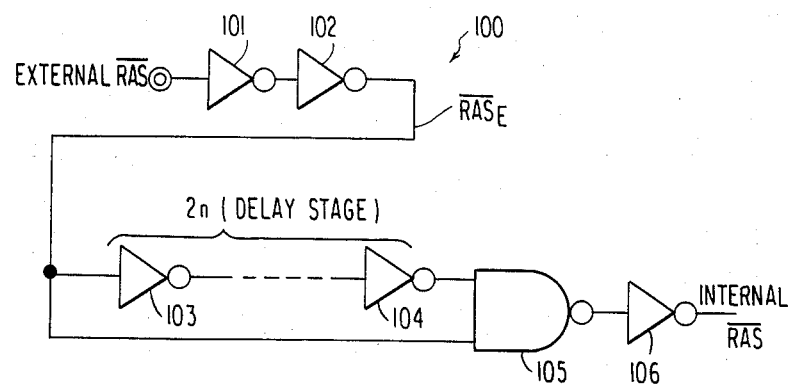
FIG. 3 is a schematic diagram of an internal /RAS signal generating circuit used in the present invention.
Figure 4:
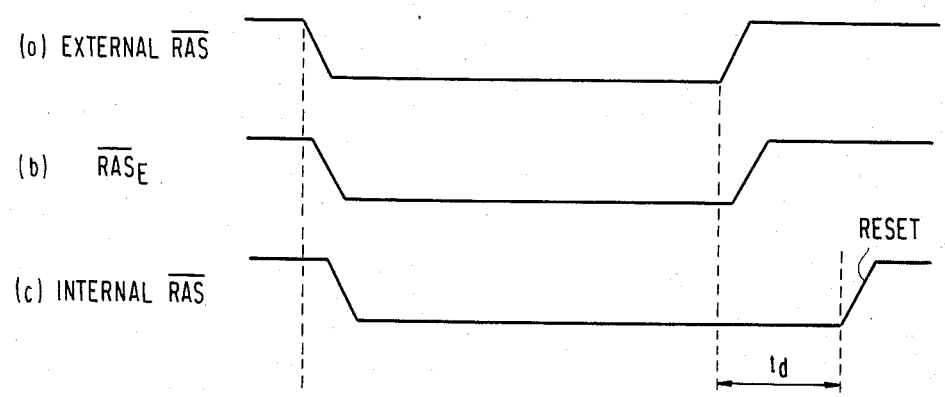
FIG. 4 is a waveform diagram showing the internal signal /RAS generated in the circuit of FIG. 3.
Figure 5:
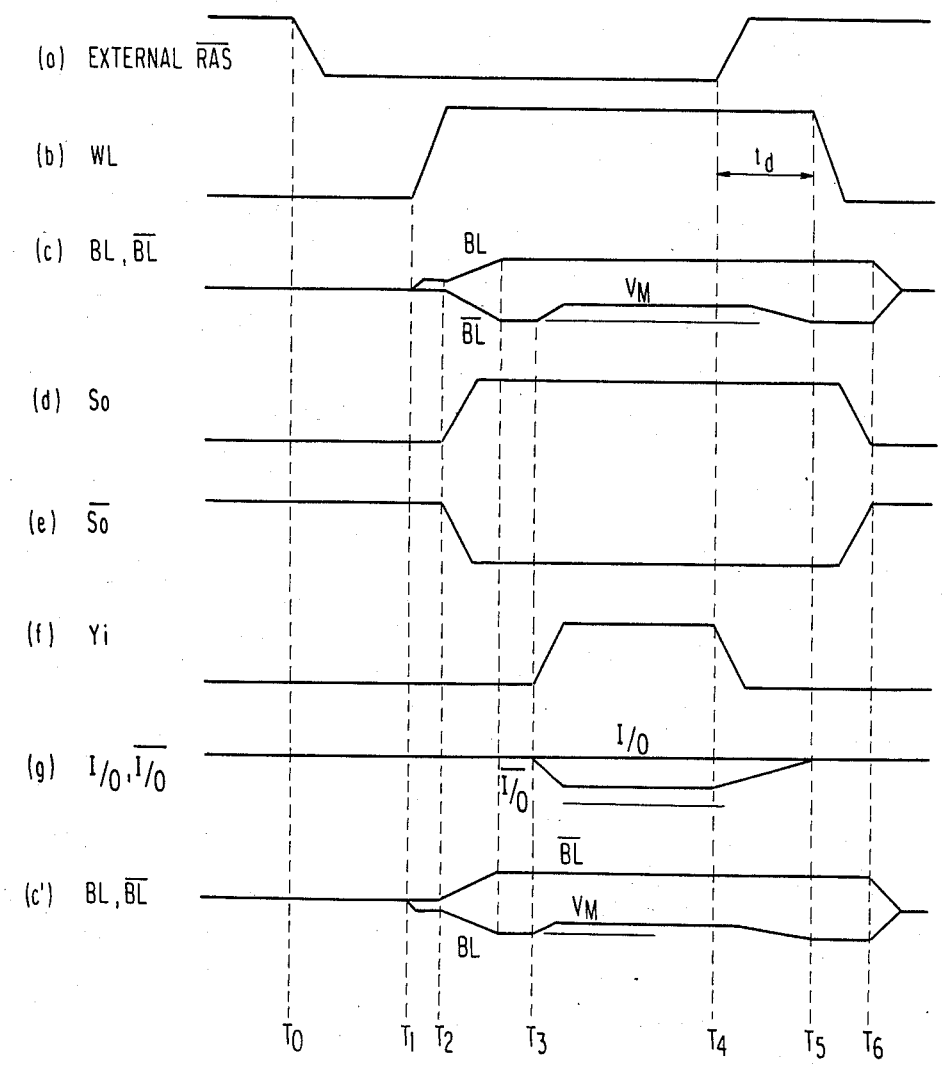
FIG. 5 is a waveform diagram showing waveforms in a D-RAM constructed in accordance with the present invention.

FIG. 3 is a schematic diagram of a control circuit 100 used to generate an internal /RAS signal, and FIG. 4 is a waveform diagram used to explain the operation of the circuit of FIG. 3. FIG. 5 shows waveforms in the overall D-RAM device according to the present invention.

With reference to FIG. 3, inverter 101 receives the external /RAS signal. The number of inverters should be even so as to not invert the external /RAS signal. A delay stage is provided for delaying the output /$RAS_E$ of the inverter 102, and is composed of inverters 103, ..., 104. A NAND gate 105 receives the output of the delay stage and the output /$RAS_E$ of the inverter 102. An inverter 106 receives as an input, the output of the NAND gate 105. The output of the inverter 106 is an internal /RAS signal, as shown in waveform (c) of FIG. 4. As shown in waveforms (a) and (b) of FIG. 4, the transition from "H" to "L" of the internal /RAS signal occurs at substantially the same time as the same transition in the external /RAS signal. On the other hand, the transition from "L" to "H" of the internal /RAS signal is delayed with respect to the like transition of the external /RAS signal by a time period $t_d$.

The internal /RAS signal is used to control the word signal WL and the first and second sense enable signals $S_0$ and /$S_0$, and also to enable the equalizer circuit 14. Hence, the transition from the "H" to the "L" state of the word signal WL, the resetting of the sense amplifier 16, and the setting (activation) of the equalizer circuit 14 are delayed with respect to the "H" to "L" transition of the column signal $Y_i$, but there is no effect on the setting ("L" to "H" transition) of the word signal WL, the setting of the sense amplifier 16, and the resetting (deactivation) of the equalizer circuit 14.

The operation of the D-RAM device of the invention will now be explained with reference to FIGS. 1 and 3 to 5.

It is assumed that the selected memory cell connected to the bit line BL has stored a "1" data bit. The potential on the bit lines BL and /BL will be about half the supply voltage, as described previously.

The external /RAS signal will undergo a transition from "H" to "L", as shown in waveform (a) in FIG. 5, at time $T_0$, and the internal /RAS signal will undergo the same transition at substantially the same time. The word signal on the selected word line WL changes from the "L" level to the "H" level at time $T_1$ according to the change of the internal /RAS signal, as shown in waveform (b). As a result, the transistor 4 of the selected memory cell will be rendered conductive, and the potential of the bit line BL will rise, as seen in waveform (c). A time $T_2$, the first enable signal $S_0$ transits to the "H" level from the "L" level while the second enable signal /$S_0$ makes the opposite transition, as shown in waveforms (d) and (e) of FIG. 5. As a result, the first and second enable transistors 7 and 8 are made conductive, whereupon the sense amplifier is enabled.

The sense amplifier 16 amplifies the potential of the two bit lines BL and /BL. The potential of the uncomplemented bit line BL is an "H" level ($V_{cc}$), while the potential of the complemented bit line /BL is an "L" level (ground), as seen in waveform (c) in FIG. 5. At time $T_3$, the column signal $Y_i$ from the column decoder 15 goes to the "H" level from the "L" level, as seen in waveform (f), and the first and second transfer transistors 8 and 9 are rendered conductive. Accordingly, the potentials of the two bit lines BL and /BL are transferred to the input/output lines I/O and /I/O, respectively. The potential of the line I/O is at the "H" level, and the potential of the line /I/O is at the intermediate level, as seen in waveform (g) in FIG. 5. That is, because current flows from the supply potential node to ground through the input/output load transistor 11, the input/output /I/O, the second transfer transistor 9, the bit line /BL, the second driver transistor 6, the first common node 16a, and the first enable transistor 7, and the drive capacities of the input/output load transistors 10 and 11 and the driver transistors 5 and 6 are substantially the same, the potential of the input/output line I/O will not swing between the full difference between the supply potential and ground, and will be limited to the intermediate potential. Hence, the potential of the complemented bit line /BL will be the intermediate potential $V_m$, namely, less than half the value of the difference between the supply potential and ground, as shown in waveform (c) of FIG. 5.

At time $T_4$, the external signal /RAS goes from "L" to "H", as shown in waveform (a) in FIG. 5, but the internal /RAS signal is maintained at the "H" level. The column signal $Y_i$ drops from the "H" level to the "L" level, and the first and second transfer transistors 8 and 9 and made nonconductive. Hence, as shown in waveform (c) of FIG. 5, the potential of the bit line /BL is pulled from the intermediate level $V_m$ to ground through the path through the second driver transistor 6, the first common node 16a, and the first enable transistor 7. The input/output line /I/O goes up to the "H" potential, as shown in waveform (g) of FIG. 5.

At time $T_5$, which is delayed by the period $t_d$ from time $T_4$, the internal /RAS signal rises from the "L" level to the "H" level. The word line signal WL goes from "H" to "L" after a period $t_d$ followed the change of the external /RAS signal, as shown in waveform (b) of FIG. 5, whereupon the transistor 4 of the selected memory cell is made nonconductive. At time $T_6$, the first enable signal $S_0$ goes down from the "H" to the "L" level, and the second enable signal /$S_0$ makes the opposite transition, as shown in waveforms (d) and (e) in FIG. 5. The first and second enable transistors 7 and 1 are then nonconductive. As a result, the equalizer circuit 14 is enabled following the change of the internal /RAS signal, and the potentials of the bit lines are made the same.

If a "0" has been stored in the selected memory cell, the operation is essentially the same as that already described. However, the potentials of the bit lines BL and /BL will be as shown in waveform (c') of FIG. 5. As shown in waveform (c') of FIG. 5, the potential of the bit line BL connected to the selected memory cell storing a "0" is at ground level after the time $T_4$. Also, after time $T_4$ the transfer transistors 8 and 9 are nonconductive, and the first and second enable transistors 7 and 1 and the transistor 4 of the selected memory cell are in the conductive state. Hence, the potential stored in the selected memory cell is pulled down to ground level through the path through the transistor 4 of the selected memory cell, the bit line BL, the first driver transistor 5, the first common node 16a, and the first enable transistor 7. Subsequently, the transistor 4 and the first and second enable transistors 7 and 1 are rendered nonconductive. Accordingly, the potential of the charge storage device in the selected memory cell is ground level. As a result, the correct information will always be read out of the cell.

What is claimed is:

1. A dynamic random access memory device comprising:
   (a) a plurality of pairs of bit lines (BL, /BL);
   (b) a plurality of word lines (WL) for applying word signals;
   (c) a plurality of memory cells, each of said memory cells being connected to a respective bit line and a respective word line, and each of said memory cells comprising a MOS transistor (4) and charge storage means (12);
   (d) a plurality of sense amplifier circuits (16), each of said sense amplifier circuits comprising a first and a second MOS driver transistor, said first driver transistor being connected between one bit line of a corresponding pair of bit lines and a common potential node, a gate electrode of said first driver transistor being connected to the other bit line of said corresponding pair of bit lines, said second driver transistor being connected between said other bit line of said corresponding pair of bit lines and said common potential node, a gate electrode of said second driver transistor being connected to said one of said corresponding pair of bit lines;
   (e) an enable MOS transistor (7) connected between said common potential node and a ground node, a gate electrode of said enable transistor receiving an enable signal;
   (f) a pair of input/output lines (I/O, /I/O);
   (g) a plurality of pairs of transfer MOS transistors, one transistor of each of said pairs of transfer transistors being connected between one bit line of an associated pair of bit lines and one of said input/output lines, a gate electrode of said one transistor of each of said pairs of transfer transistors receiving a column signal, the other transistor of each of said pairs of transfer transistors being connected between the other bit line of said associated pair of bit lines and the other of said pair of input/output lines, and a gate electrode of said other transistor of each of said pairs of transfer transistors receiving said column signal;
   (h) an input/output load (13) connected to said pair of input/output lines; and
   (i) a control circuit receiving an external /RAS signal and generating an internal /RAS signal controlling at least production of said word signals and said enable signals, a reset timing of said internal /RAS signal being delayed with respect to a reset timing of said external /RAS signal, whereby a time when the MOS transistor of a selected memory cell and said enable MOS transistor are made nonconductive is delayed beyond a time when a selected one of said pairs of transfer MOS transistors are made nonconductive.

2. The dynamic random access memory device according to claim 1, wherein said input/output load comprises first and second input/output load MOS transistors, said first transistor being connected between one of said input/output lines and a supply potential node, and said second transistor being connected between the other of said input/output lines and said supply potential node.

3. The dynamic random access memory device according to claim 1, wherein said control circuit comprises an even number of serially coupled inverters to a first input of which said external /RAS signal is applied, a delay stage to an input of which a final output of said even number of inverters is applied, a NAND gate to one input of which is applied an output of said delay stage and to another input of which is applied to said final output of said serially coupled inverters, and an inverter to an input of which is applied an output of said NAND gate, said internal /RAS signal being present at an output of said inverter.

4. The dynamic random access memory device according to claim 1, wherein said control circuit comprises a delay stage to an input of which is applied said external /RAS signal, a NAND gate to one input of which is applied an output of said delay stage and to another input of which is applied said external /RAS signal, and an inverter to an input of which is applied an output of said NAND gate, said internal /RAS signal being present at an output of said inverter.

5. The dynamic random access memory device according to claim 4, wherein said delay stage comprises an even number of inverters.

6. The dynamic random access memory device according to claim 1, wherein each of said sense amplifier circuits comprises first and second load MOS transistors.

7. The dynamic random access memory device according to claim 6, wherein said first and second driver MOS transistors are of the N type and said first and second load MOS transistors are of the P type, said first load MOS transistor is connected between one bit line of said corresponding pair of bit lines and a second common potential node, a gate electrode of said first load transistor is connected to the other bit line of said corresponding pair of bit lines, said second load MOS transistor is connected between said other bit line of said corresponding pair of bit lines and said second common node, and a gate electrode of said second load transistor is connected to said one bit line of said corresponding pair of bit lines.

8. The dynamic random access memory device according to claim 7, further comprising a second enable MOS transistor (1) connected between said second common potential node and a supply potential node.

9. The dynamic random access memory device according to claim 8, wherein said second enable MOS transistor is of the P type, and a gate electrode of said second enable MOS transistor receives a second enable signal complementary to said first enable signal.

10. The dynamic random access memory device according to claim 8, further comprising a plurality of equalizer circuits, each of said equalizer circuits being connected between a respective pair of said bit lines.

11. The dynamic random access memory device according to claim 10, wherein each of said equalizer circuits comprises an MOS transistor.

12. A dynamic random access memory device comprising:
(a) a plurality of pairs of bit lines (BL,/BL);
(b) a plurality of word lines (WL) for applying word signals;
(c) a plurality of memory cells, each of said memory cells being connected to a respective bit line and a respective word line, and each of said memory cells comprising a MOS transistor (4) and charge storage means (12).
(d) a plurality of sense amplifier circuits (16), each of said sense amplifier circuits comprising a first and a second N-type MOS transistor, said first driver transistor being connected between one bit line of a respective pair of said bit lines and a first common potential node, a gate electrode of said first driver transistor being connected to the other bit line of said respective pair of bit lines, said second driver transistor being connected between said other bit line and said first common node, a gate electrode of said second driver transistor being connected to said one bit line, said first load transistor being connected between said one bit line of said respective pair of bit lines and a second common potential node, a gate electrode of said first load transistor being connected to said other bit line of said respective pair of bit lines, said second load transistor being connected between said other bit line of said respective pair of bit lines and said second common potential node, a gate electrode of said second load transistor being connected to said one bit line of said respective pair of bit lines;
(e) a first enable N-type MOS transistor (7) connected between said first common potential node and a ground node, a gate electrode of said first enable transistor receiving a first enable signal;
(f) a second enable P-type MOS transistor (1) connected between said second common potential node and a supply potential node, a gate electrode of said second enable transistor receiving a second enable signal;
(g) a plurality of equalizer circuits for equalizing a potential between the bit lines of respective pairs of said bit lines before and after read-out of information from the respective memory cells, each of said equalizer circuits being connected between a respective pair of said bit lines;
(h) a pair of input/output lines (I/O, /I/O);
(i) a plurality of pairs of transfer N-type MOS transistors, one transistor of each of said pairs of transfer transistors being connected between one bit line of a respective pair of said bit lines and one of said input/output lines, a gate electrode of said one transistor receiving a column signal, the other transistor of each of said pairs of transfer transistors being connected between the other of said bit lines of said respective pair of bit lines and the other of said input/output lines, and a gate electrode of said other transistor of each of said pairs of transfer transistors receiving said column signal;
(j) an input/output load (13) connected to said pair of input/output lines; and
(k) a control circuit receiving an external /RAS signal and producing an internal /RAS signal controlling at least said column signal, said first and second enable signals, and signals for enabling said equalizer circuits, a reset timing of said internal /RAS signal being delayed with respect to a reset timing of said external /RAS signal, whereby a time when the MOS transistor of said memory cell and a selected enable MOS transistor are made nonconductive is delayed beyond a time when a selected one of said pairs of transfer MOS transistors are made nonconductive.

13. The dynamic random access memory device according to claim 12, wherein said equalizer circuits each comprise a MOS transistor connected between a respective pair of said bit lines, a gate electrode of said transistor being receiving a signal controlled by said internal /RAS signal.

14. The dynamic random access memory device according to claim 12, wherein said input/output load comprises first and second input/output load MOS transistors, said first transistor being connected between one of said input/output lines and a supply potential node, and said second transistor being connected between the other of said input/output lines and said supply potential node.

15. The dynamic random access memory device according to claim 12, wherein said control circuit comprises an even number of serially coupled inverters to a first input of which said external /RAS signal is applied, a delay stage to an input of which a final output of said even number of inverters is applied, a NAND gate to one input of which is applied an output of said delay stage and to another input of which is applied said final output of said serially coupled inverters, and an inverter to an input of which is applied an output of said NAND gate, said internal /RAS signal being present at an output of said inverter.

16. The dynamic random access memory device according to claim 12, wherein said control circuit comprises a delay stage to an input of which is applied said external /RAS signal, a NAND gate to one input of which is applied an output of said delay stage and to another input of which is applied said external /RAS signal, and an inverter to an input of which is applied an output of said NAND gate, said internal /RAS signal being present at an output of said inverter.

17. The dynamic random access memory device according to claim 16, wherein said delay stage comprises an even number of inverters.

* * * * *